(12) United States Patent
Shin et al.

(10) Patent No.: US 8,742,855 B2
(45) Date of Patent: Jun. 3, 2014

(54) FEED-FORWARD RING OSCILLATOR

(75) Inventors: Hyung Soon Shin, Seoul (KR); Sung Min Park, Seongnam-si (KR); Na Rae Jeong, Bucheon-si (KR); Ji Sook Yun, Seongnam-si (KR); Yu Jin Kim, Goyang-si (KR)

(73) Assignee: EWHA University-Industry Collaboration Foundation, Seoul (KR)

( * ) Notice: Subject to any disclaimer, the term of this patent is extended or adjusted under 35 U.S.C. 154(b) by 254 days.

(21) Appl. No.: 13/318,833

(22) PCT Filed: Dec. 28, 2009

(86) PCT No.: PCT/KR2009/007819
§ 371 (c)(1),
(2), (4) Date: Nov. 4, 2011

(87) PCT Pub. No.: WO2011/007944
PCT Pub. Date: Jan. 20, 2012

(65) Prior Publication Data
US 2012/0098605 A1   Apr. 26, 2012

(30) Foreign Application Priority Data
Jul. 13, 2009   (KR) .................. 10-2009-0063558

(51) Int. Cl.
*H03K 3/03*   (2006.01)

(52) U.S. Cl.
CPC .................................. *H03K 3/0322* (2013.01)
USPC .............................................. 331/57; 327/288

(58) Field of Classification Search
USPC ........................................ 331/57; 327/287, 288
See application file for complete search history.

(56) References Cited

U.S. PATENT DOCUMENTS 6,424,192 B1 *  7/2002  Lee et al. ...................... 327/156
7,256,657 B2 *  8/2007  Sanchez et al. ................. 331/34

FOREIGN PATENT DOCUMENTS

| KR | 1019990025790 | 4/1999 |
| KR | 1020080046260 | 5/2008 |

* cited by examiner

*Primary Examiner* — Joseph Chang
(74) *Attorney, Agent, or Firm* — Lexyoume IP Meister, PLLC

(57) ABSTRACT

Disclosed herein is a feed-forward ring oscillator. The feed-forward ring oscillator includes a plurality of delay cells for receiving a first differential input signal pair and a second differential input signal pair, and outputting a differential output signal pair. The delay cells are connected in a ring shape. Each of the delay cells receives a differential output signal pair of a delay cell of a previous stage as a first differential input signal pair and receives a differential output signal pair of a delay cell of a stage before the previous stage as a second differential input signal pair. Each of the delay cells comprises multiple independent gate field-effect transistors.

3 Claims, 3 Drawing Sheets

FEED-FORWARD RING OSCILLATOR

BACKGROUND OF THE INVENTION

1. Field of the Invention

The present invention relates generally to a feed-forward ring oscillator, and, more particularly, to a feed-forward ring oscillator using multiple independent gate field-effect transistors.

2. Description of the Related Art

Ring-type oscillators have been generally used as clock generation circuits because of their advantages in terms of good efficiency, a wide frequency range, and a small area. The frequency of oscillation of such a ring-type oscillator may be generally calculated using the following equation:

$$f_{osc}=1/(2Nt_d) \tag{1}$$

where N is the number of delay cells, and $t_d$ indicates a delay time of a single delay cell. Since the frequency of oscillation of a ring oscillator is inversely proportional to N, there are limitations in operational reliability and the area of the oscillator when a large number of delay stages are used.

Feed-forward ring oscillators are ring oscillators that have been developed in order to overcome such limitations. The structure of such a feed-forward ring oscillator is such that a feed-forward loop is added to a ring oscillator in the existing type of manner. The delay cells of the existing feed-forward ring oscillator additionally require field-effect transistors in order to form input pairs used for the feed-forward loop.

The feed-forward ring oscillator having such a delay cell has the disadvantage of occupying a large area because of the additional field-effect transistors.

SUMMARY OF THE INVENTION

Accordingly, the present invention has been made keeping in mind the above problems occurring in the prior art, and an object of the present invention is to provide a feed-forward ring oscillator in which the number of elements of a delay cell is reduced using multiple independent gate field-effect transistors, thereby reducing an occupying area and improving the degree of integration of a circuit.

In order to accomplish the above object, the present invention provides a feed-forward ring oscillator, including a plurality of delay cells for receiving a first differential input signal pair and a second differential input signal pair, and outputting a differential output signal pair. The delay cells are connected in a ring shape. Each of the delay cells receives the differential output signal pair of the delay cell of a previous stage as a first differential input signal pair and receives the differential output signal pair of the delay cell of a stage before the previous stage as a second differential input signal pair. Each of the delay cells includes multiple independent gate field-effect transistors.

Here, it is preferable that each of the delay cells include first and second multiple independent gate field-effect transistors, that the first signal of the second differential input signal pair be input to the first gate of the first multiple independent gate field-effect transistor, that thee second signal of the second differential input signal pair be input to the first gate of the second multiple independent gate field-effect transistor, that a control voltage be connected to the second gate of the first multiple independent gate field-effect transistor and the second gate of the second multiple independent gate field-effect transistor.

Here, it is preferable that each of the delay cells further include third and fourth multiple independent gate field-effect transistors which are connected to the first and second multiple independent gate field-effect transistors in series, respectively, that the first signal of the first differential input signal pair be input to two gates of the third multiple independent gate field-effect transistor, and that the second signal of the first differential input signal pair is input to the two gates of the fourth multiple independent gate field-effect transistor.

Here, it is preferable that each of the delay cells further include a current source for supplying current to the third and fourth multiple independent gate field-effect transistors.

Here, it is preferable that the first and second multiple independent gate field-effect transistors be P-type field-effect transistors, and the third and fourth multiple independent gate field-effect transistors be N-type field-effect transistors, that the drain of the first multiple independent gate field-effect transistor and the drain of the second multiple independent gate field-effect transistor be connected to the drain of the third multiple independent gate field-effect transistor and the drain of the fourth multiple independent gate field-effect transistor, respectively, and that the drain stage of the third multiple independent gate field-effect transistor and the drain stage of the fourth multiple independent gate field-effect transistor correspond to the differential output signal pair.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
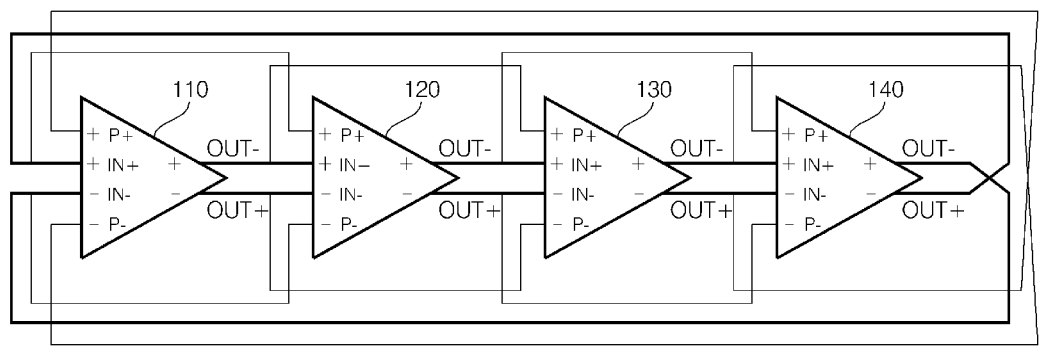
FIG. 1 is a view illustrating the configuration of a feed-forward ring oscillator according to an embodiment of the present invention.

Reference now should be made to the drawings, in which the same reference numerals are used throughout the different drawings to designate the same components, so that a repetitive description can be omitted. Further, when detailed descriptions of well-known functions or configurations may unnecessarily obscure the gist of the present invention, the detailed descriptions will be omitted.

FIG. 1 is a view illustrating the configuration of a feed-forward ring oscillator according to an embodiment of the present invention. As shown in the drawing, the feed-forward ring oscillator according to the embodiment of the present invention includes a plurality of delay cells which are connected in a ring shape. Although the illustrated embodiment shows a case in which there are four delay cells, it is apparent that the number of delay cells may be appropriately selected based on the required frequency of oscillation.

Each of the delay cells receives two differential input signal pairs, that is, a first differential input signal pair IN+ and IN− and a second differential input signal pair P+ and P−, as inputs, and outputs a differential output signal pair OUT+ and OUT− which is delayed for a specific time compared to the inputs. Referring to FIG. 1, thick solid lines indicate a primary loop and thin solid lines indicate a secondary loop, that is, a feed-forward loop.

The configuration of the primary loop is that a differential output signal pair from the delay cell of a previous stage corresponds to the first differential input signal pair of a current stage delay cell. Here, the first differential input signal pair is made in such a way that the polarity of the differential output signal pair is reversed. For example, the differential output signal pair OUT− and OUT+ of a delay cell 110 becomes the first differential input signal pair IN+ and IN− of a delay cell 120, the differential output signal pair OUT− and OUT+ of the delay cell 120 becomes the first differential input signal pair IN+ and IN− of a delay cell 130, the differential output signal pair OUT− and OUT+ of the delay cell 130 becomes the first differential input signal pair IN+ and IN− of a delay cell 140, and the differential output signal pair OUT− and OUT+ of the delay cell 140 becomes the first differential input signal pair IN+ and IN− of the delay cell 110 again.

The secondary loop has a configuration in which the differential output signal pair from the delay cell of the stage before the previous stage corresponds to the second differential input signal pair of the delay cell of a current stage. Here, the second differential input signal pair is made in such a way that the polarity of the differential output signal pair is reversed. For example, the differential output signal pair OUT− and OUT+ of the delay cell 110 becomes the second differential input signal pair P+ and P− of the delay cell 130, the differential output signal pair OUT− and OUT+ of the delay cell 120 becomes the second differential input signal pair P+ and P− of the delay cell 140, the differential output signal pair OUT− and OUT+ of the delay cell 130 becomes the first differential input signal pair P+ and P− of the delay cell 110, and the differential output signal pair OUT− and OUT+ of the delay cell 140 becomes the first differential input signal pair P+ and P− of the delay cell 120.

Figure 2:
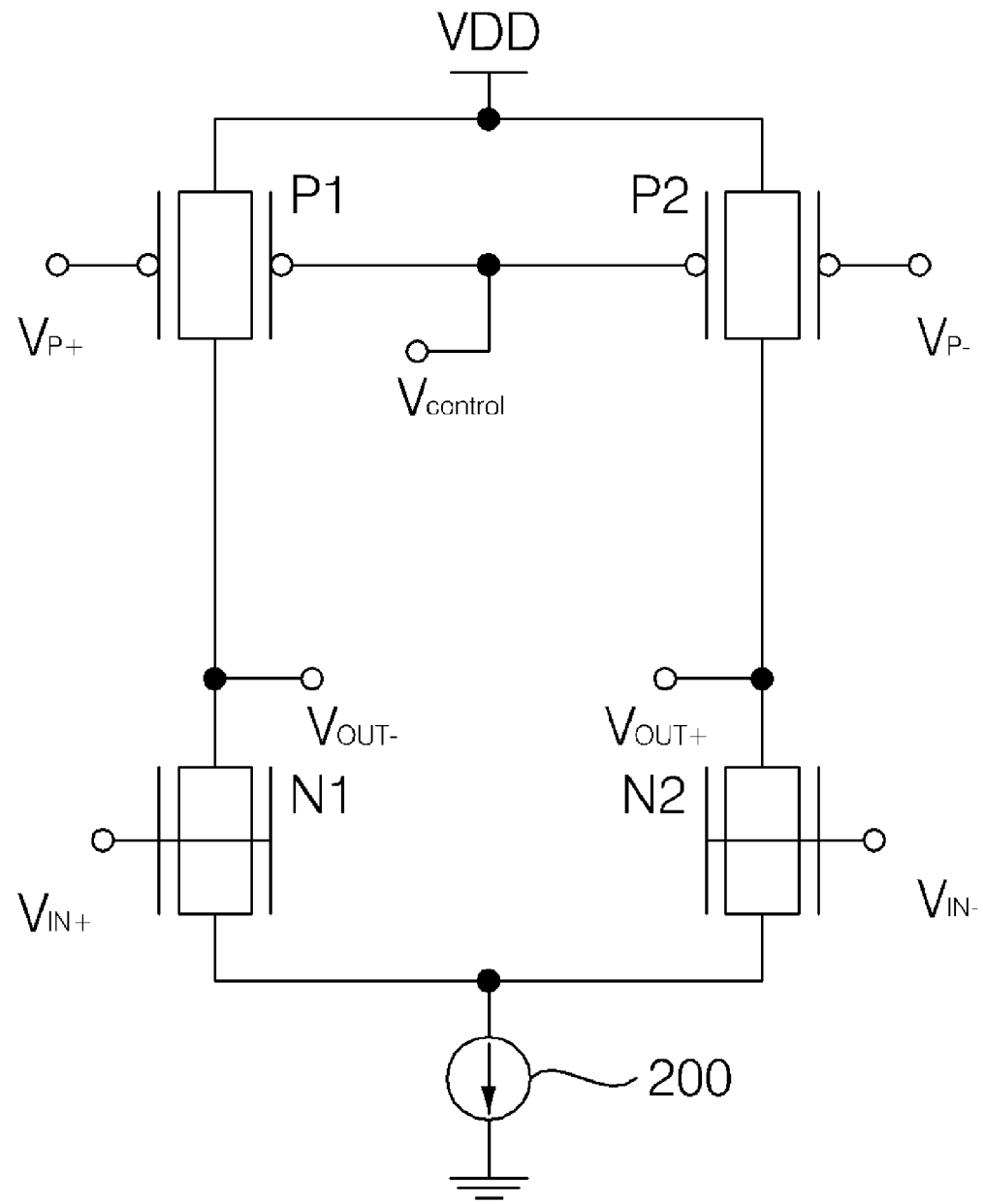
FIG. 2 is a circuit diagram illustrating the delay cell of the feed-forward ring oscillator of FIG. 1.

FIG. 2 is a circuit diagram illustrating the delay cell of the feed-forward ring oscillator of FIG. 1.

A delay cell according to the embodiment of the present invention is configured using multiple independent gate field-effect transistors. Such a multiple independent gate field-effect transistor is configured in such a way as to integrate a plurality of gates, which independently operate, into a single transistor.

Figure 3:
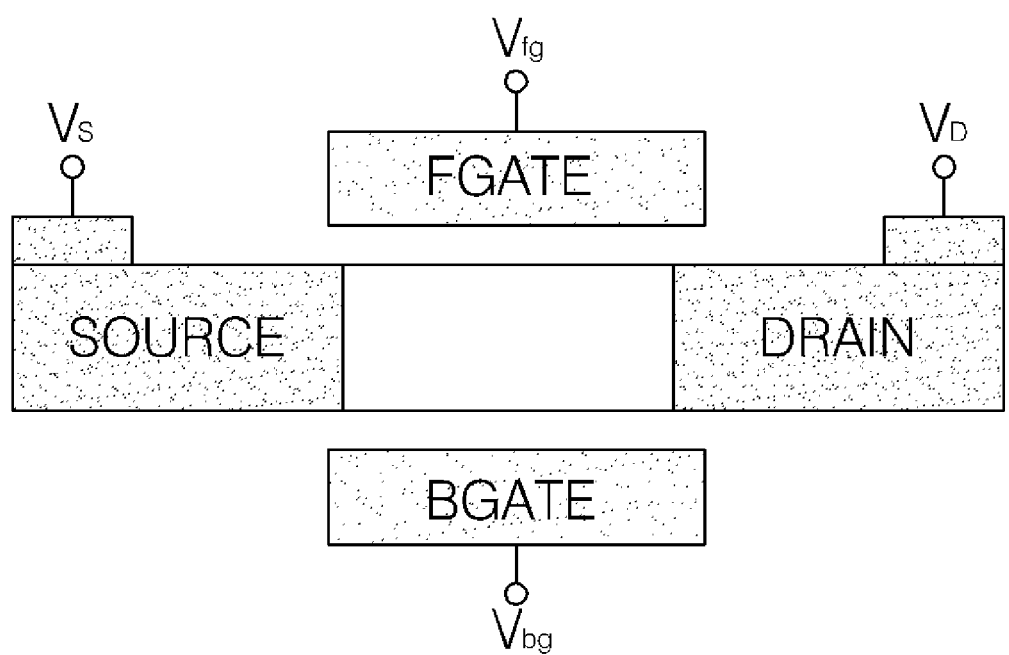
FIG. 3 is a view illustrating the structure of a multiple independent gate field-effect transistor used in an embodiment of the present invention.

FIG. 3 is a view illustrating the structure of a multiple independent gate field-effect transistor according to the present embodiment of the present invention. The multiple independent gate field-effect transistor according to the present embodiment is a 4-stage element including two independent gates fgate and bgate, and voltages Vfg and Vbg which are different from each other may be applied to the gates fgate and bgate, respectively. Thereafter, the distribution of charges is asynchronously formed in silicon based on the voltages applied to the two gates. Therefore, when voltages which are different from each other are applied to the respective gates, the multiple independent gate field-effect transistor may operate as two transistors which have respective threshold voltages which are different from each other.

Referring to FIG. 2 again, a delay cell includes first and second multiple independent gate field-effect transistors P1 and P2, third and fourth multiple independent gate field-effect transistors N1 and N2, and a current source 200 which supplies current to the third and fourth multiple independent gate field-effect transistors N1 and N2. The first and second multiple independent gate field-effect transistors P1 and P2 are P-type field-effect transistors, and the third and fourth multiple independent gate field-effect transistors N1 and N2 are N-type field-effect transistors.

The first and second multiple independent gate field-effect transistors P1 and P2 have respective sources which are connected to a voltage source VDD, and have drains which are connected to the drains of the respective third and fourth multiple independent gate field-effect transistors N1 and N2. The first multiple independent gate field-effect transistor P1 has a first gate to which the first signal $V_{P+}$ of the second differential input signal pair is input, and has a second gate to which the control voltage $V_{control}$ is applied in order to control the operating frequency by controlling the gate voltage. The second multiple independent gate field-effect transistor P2 has a first gate to which the second signal $V_{P−}$ of the second differential input signal pair is input, and has a second gate to which a control voltage $V_{control}$ is applied in order to control the operating frequency by controlling the gate voltage.

The third and fourth multiple independent gate field-effect transistors N1 and N2 have respective sources which are connected to the current source 200. The third multiple independent gate field-effect transistor N1 includes two common gates to which the first signal $V_{IN+}$ of the first differential input signal pair is input. The fourth multiple independent gate field-effect transistor N includes two common gates to which the second signal $V_{IN−}$ of the first differential input signal pair is input.

Further, the drain of the third multiple independent gate field-effect transistor N1 receives the first signal $V_{IN+}$ of the differential output signal pair, and the drain of the fourth multiple independent gate field-effect transistor N2 receives the second signal $V_{IN−}$ of the differential output signal pair.

According to the embodiment of the present invention, a differential output signal pair from the delay cell of the stage before a previous stage is input to each of the first gates of the first and second multiple independent gate field-effect transistors P1 and P2 included in the delay cell. Therefore, first sides of the respective first and second multiple independent gate field-effect transistors P1 and P2 perform the function of forming a secondary loop. The secondary loop, formed as described above, causes the delay value of each delay cell to be small compared to a ring oscillator which only has a primary loop.

Further, a control voltage $V_{control}$ is applied to each of the second gates of the first and the second multiple independent gate field-effect transistors P1 and P2. Therefore, resistance of the second gates of the first and second multiple independent gate field-effect transistors P1 and P2 varies depending on the control voltage $V_{control}$, thereby performing a load function.

The third and fourth multiple independent gate field-effect transistors N1 and N2 use two common gates, and a differential output signal pair from the delay cell of a previous stage is input to the two gates, thereby performing the same function as a general N-channel Metal-Oxide Semiconductor (NMOS).

The above-described present invention uses multiple independent gate field-effect transistors, thereby realizing a circuit which can perform a load function and a feed-forward function using a single element. Therefore, the number of elements of each of the delay cells of the feed-forward ring oscillator can be reduced, thereby reducing an occupying area and improving the degree of integration of the circuit.

According to the present invention the number of elements of a delay cell is reduced using multiple independent gate field-effect transistors, thereby having the advantages of reducing an occupying area and improving the degree of integration of a circuit.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Therefore, the disclosed embodiments should be considered not from the point of view of being a limitation but from the point of view of being an explanation. The scope of the present invention is not disclosed by the above-described explanation but by the following claims and all differences within the equivalent scope of the present invention should be understood to be included in the present invention.

What is claimed is:

1. A feed-forward ring oscillator, comprising:
a plurality of delay cells for receiving a first differential input signal pair and a second differential input signal pair, and outputting a differential output signal pair, wherein:
the delay cells are connected in a ring shape;
each of the delay cells receives a differential output signal pair of a delay cell of a previous stage as a first differential input signal pair and receives a differential output signal pair of a delay cell of a stage before the previous stage as a second differential input signal pair;
each of the delay cells comprises multiple independent gate field-effect transistors;
the multiple independent gate field-effect transistors comprise first and second multiple independent gate field-effect transistors, and third and fourth multiple independent gate field-effect transistors that are connected to the first and second multiple independent gate field-effect transistors in series, respectively;
a first signal of the second differential input signal pair is input to a first gate of the first multiple independent gate field-effect transistor;
a second signal of the second differential input signal pair is input to a first gate of the second multiple independent gate field-effect transistor;
a control voltage is connected to a second gate of the first multiple independent gate field-effect transistor and a second gate of the second multiple independent gate field-effect transistor;
a first signal of the first differential input signal pair is input to two gates of the third multiple independent gate field-effect transistor; and
a second signal of the first differential input signal pair is input to two gates of the fourth multiple independent gate field-effect transistor.

2. The feed-forward ring oscillator as set forth in claim 1, wherein each of the delay cells further comprises a current source for supplying current to the third and fourth multiple independent gate field-effect transistors.

3. The feed-forward ring oscillator as set forth in claim 1, wherein:
the first and second multiple independent gate field-effect transistors are P-type field-effect transistors, and the third and fourth multiple independent gate field-effect transistors are N-type field-effect transistors;
drain of the first multiple independent gate field-effect transistor and drain of the second multiple independent gate field-effect transistor are connected to drain of the third multiple independent gate field-effect transistor and drain of the fourth multiple independent gate field-effect transistor, respectively; and
a drain stage of the third multiple independent gate field-effect transistor and a drain stage of the fourth multiple independent gate field-effect transistor correspond to the differential output signal pair.

* * * * *